(12) United States Patent
Happ et al.

(10) Patent No.: US 7,889,536 B2
(45) Date of Patent: Feb. 15, 2011

(54) INTEGRATED CIRCUIT INCLUDING QUENCH DEVICES

(75) Inventors: Thomas Happ, Dresden (DE); Jan Boris Philipp, Munich (DE)

(73) Assignee: Qimonda AG, Munich (DE)

(*) Notice: Subject to any disclaimer, the term of this patent is extended or adjusted under 35 U.S.C. 154(b) by 157 days.

(21) Appl. No.: 11/957,878

(22) Filed: Dec. 17, 2007

(65) Prior Publication Data

US 2009/0154226 A1 Jun. 18, 2009

(51) Int. Cl.
*G11C 11/00* (2006.01)
*G11C 11/36* (2006.01)

(52) U.S. Cl. .................. 365/148; 365/163; 365/175
(58) Field of Classification Search .................. 365/148, 365/158, 163, 171, 173, 175
See application file for complete search history.

(56) References Cited

U.S. PATENT DOCUMENTS

| | | | | |
|---|---|---|---|---|
| 5,297,104 | A * | 3/1994 | Nakashima | 365/230.06 |
| 6,014,331 | A * | 1/2000 | Chih | 365/185.25 |
| 6,862,214 | B2 | 3/2005 | Lee et al. | |
| 6,985,389 | B2 | 1/2006 | Ma | |
| 7,130,214 | B2 * | 10/2006 | Lee | 365/163 |
| 7,215,592 | B2 * | 5/2007 | Cho et al. | 365/163 |
| 7,227,776 | B2 * | 6/2007 | Cho et al. | 365/163 |
| 7,283,387 | B2 * | 10/2007 | Cho et al. | 365/163 |
| 7,295,464 | B2 * | 11/2007 | Cho et al. | 365/163 |
| 7,304,885 | B2 * | 12/2007 | Cho et al. | 365/163 |
| 7,339,814 | B2 * | 3/2008 | Happ | 365/148 |
| 7,359,231 | B2 * | 4/2008 | Venkataraman et al. | 365/148 |
| 7,362,608 | B2 * | 4/2008 | Schwerin et al. | 365/163 |
| 7,391,644 | B2 * | 6/2008 | Cho et al. | 365/163 |
| 7,405,960 | B2 * | 7/2008 | Cho et al. | 365/148 |
| 7,405,965 | B2 * | 7/2008 | Choi et al. | 365/163 |
| 7,417,887 | B2 * | 8/2008 | Cho et al. | 365/148 |
| 7,423,901 | B2 * | 9/2008 | Sutardja | 365/163 |
| 7,440,315 | B2 * | 10/2008 | Lung | 365/163 |
| 7,443,721 | B2 * | 10/2008 | Kurotsuchi et al. | 365/163 |
| 7,447,062 | B2 * | 11/2008 | Burr et al. | 365/163 |
| 7,489,552 | B2 * | 2/2009 | Kurotsuchi et al. | 365/163 |
| 7,518,925 | B2 * | 4/2009 | Kuramori | 365/185.18 |
| 7,539,048 | B2 * | 5/2009 | Farnworth | 365/163 |
| 7,545,668 | B2 * | 6/2009 | Philipp et al. | 365/148 |
| 7,577,023 | B2 * | 8/2009 | Philipp et al. | 365/148 |
| 2006/0250863 | A1 | 11/2006 | Nakai et al. | |

* cited by examiner

*Primary Examiner*—Trong Phan
(74) *Attorney, Agent, or Firm*—Dicke, Billig & Czaja, PLLC

(57) ABSTRACT

An integrated circuit includes a line, at least two quench devices coupled to the line, and a resistivity changing material memory cell coupled to the line. The at least two quench devices are configured to quench a write signal on the line during a write operation of the memory cell.

18 Claims, 5 Drawing Sheets

INTEGRATED CIRCUIT INCLUDING QUENCH DEVICES

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes of the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The temperature in the phase change material in each memory cell generally corresponds to the applied level of current and/or voltage to achieve the heating.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The programming speed of a phase change memory cell is limited by the time required to set the memory cell to the crystalline state. To increase the programming speed of a phase change memory cell, the time required to set the memory cell to the crystalline state should be reduced. Reducing the time required to set the memory cell to the crystalline state, however, also reduces the time available for resetting the memory cell to the amorphous state. To reset the memory cell to the amorphous state, a write signal is applied to the memory cell that resets the memory cell to the amorphous state. With the memory cell in the amorphous state, the write signal is quenched such that the memory cell remains in the amorphous state. As phase change memory cells are reduced in size and as the size of memory arrays increase, however, capacitive bit line coupling and series resistance increase, which increases quench times for reset signals.

For these and other reasons, there is a need for the present invention.

SUMMARY

One embodiment provides an integrated circuit. The integrated circuit includes a line, at least two quench devices coupled to the line, and a resistivity changing material memory cell coupled to the line. The at least two quench devices are configured to quench a write signal on the line during a write operation of the memory cell.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
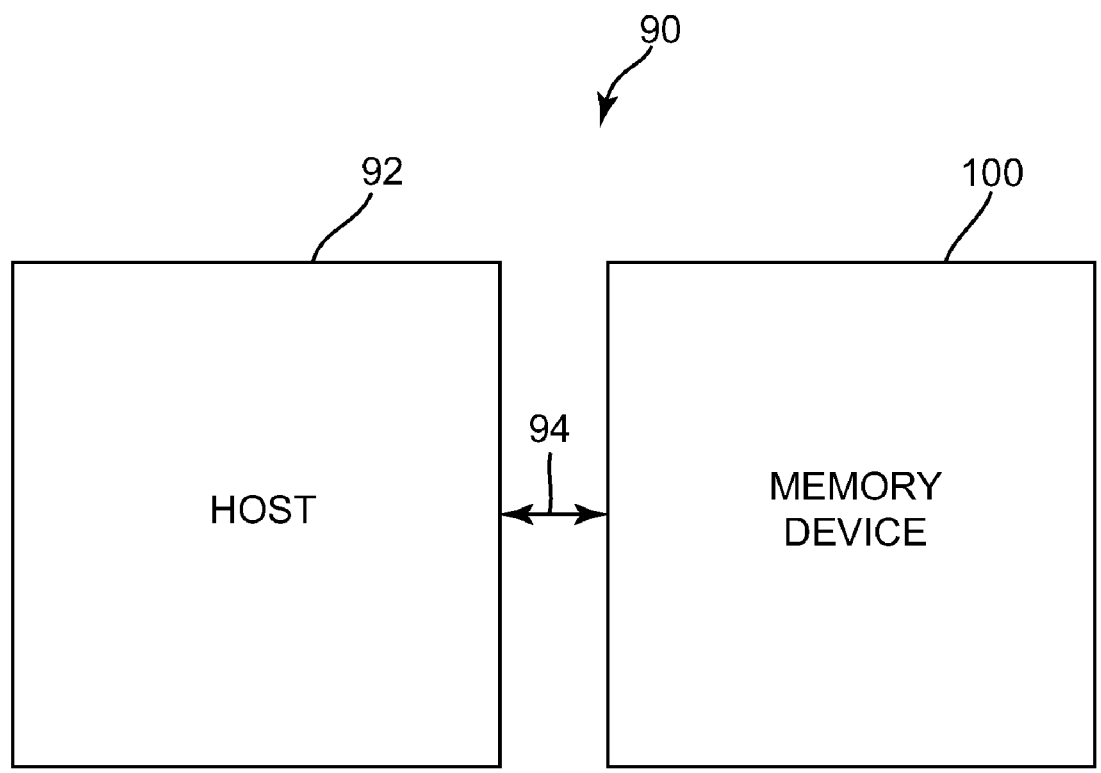
FIG. 1 is a block diagram illustrating one embodiment of a system.

FIG. 1 is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player, digital camera), or any other suitable device that uses memory. Memory device 100 provides memory for host 92. In one embodiment, memory device 100 includes a phase change memory device or other suitable resistive or resistivity changing material memory device.

Figure 2:
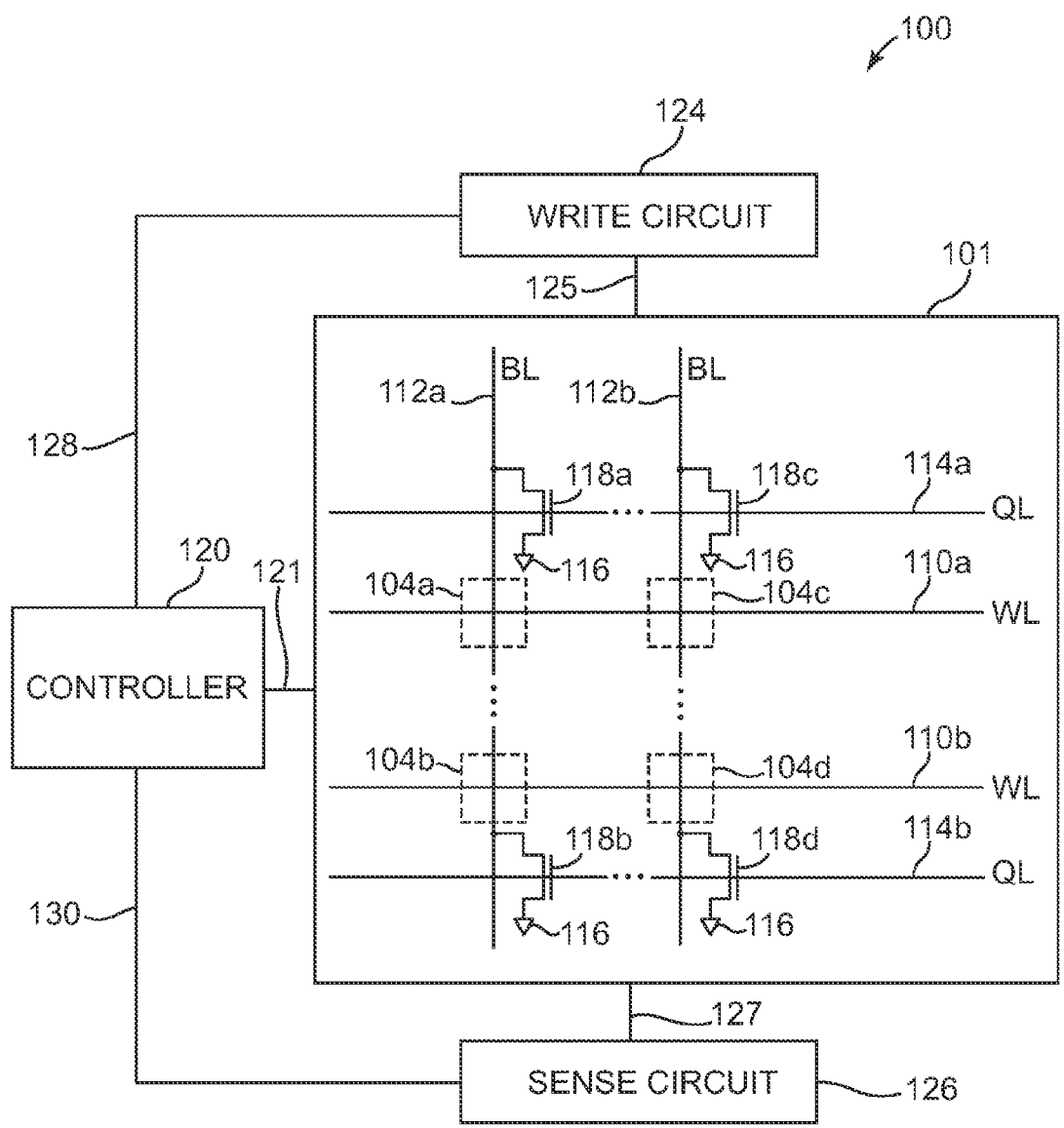
FIG. 2 is a diagram illustrating one embodiment of a memory device.

FIG. 2 is a diagram illustrating one embodiment of memory device 100. In one embodiment, memory device 100 is an integrated circuit or part of an integrated circuit. Memory device 100 includes write circuit 124, controller 120, memory array 101, and sense circuit 126. Memory array 101 includes a plurality of phase change memory cells 104a-104d (collectively referred to as phase change memory cells 104), a plurality of bit lines (BLs) 112a-112b (collectively referred to as bit lines 112), a plurality of word lines (WLs) 110a-110b (collectively referred to as word lines 110), a plurality of quench transistors 118a-118d (collectively referred to as quench transistors 118), and a plurality of quench lines (QL) 114a-114b collectively referred to as quench lines 114). In one embodiment, phase change memory cells 104a-104d are arranged in rows and columns.

As used herein, the term "electrically coupled" is not meant to mean that the elements must be directly coupled together and intervening elements may be provided between the "electrically coupled" elements.

Each bit line 112 is electrically coupled to at least two quench transistors 118. Quench transistors 118 are selected by quench lines 114 to reduce the quench time of a write signal when resetting a selected phase change memory cell 104 to an amorphous state. Quench transistors 118 quickly discharge capacitance on the selected bit line. Therefore, the time for resetting a phase change memory cell to the amorphous state is reduced, thus enabling a reduction in the time for setting a phase change memory cell to a crystalline state. In addition, quench transistors 118 enable longer bit lines and smaller memory cell sizes to be used than would be practical in typical phase change memory arrays without quench transistors 118.

Memory array 101 is electrically coupled to write circuit 124 through signal path 125, to controller 120 through signal path 121, and to sense circuit 126 through signal path 127. Controller 120 is electrically coupled to write circuit 124 through signal path 128 and to sense circuit 126 through signal path 130.

Each quench transistor 118a is electrically coupled to a bit line 112, a quench line 114, and a common or ground 116. One side of the source-drain path of quench transistor 118a is electrically coupled to bit line 112a. The other side of the source-drain path of quench transistor 118a is electrically coupled to common or ground 116. The gate of quench transistor 118a is electrically coupled to quench line 114a. One side of the source-drain path of quench transistor 118b is electrically coupled to bit line 112a. The other side of the source-drain path of quench transistor 118b is electrically coupled to common or ground 116. The gate of quench transistor 118b is electrically coupled to quench line 114b. One side of the source-drain path of quench transistor 118c is electrically coupled to bit line 112b. The other side of the source-drain path of quench transistor 118c is electrically coupled to common or ground 116. The gate of quench transistor 118c is electrically coupled to quench line 114a. One side of the source-drain path of quench transistor 118d is electrically coupled to bit line 112b. The other side of the source-drain path of quench transistor 118d is electrically coupled to common or ground 116. The gate of quench transistor 118d is electrically coupled to quench line 114b.

In one embodiment, two quench transistors 118 are provided along each bit line 112 with one of the quench transistors 118 at one end of the each bit line 112 and the other one of the quench transistors 118 at the other end of each bit line 112. In another embodiment, three quench transistors 118 are provided along each bit line 112 with a first quench transistor 118 at one end of the each bit line 112, a second quench transistor 118 at the other end of each bit line 112, and a third quench transistor 118 in the center of each bit line 112. In other embodiments, any suitable number of quench transistors 118 are provided along each bit line 112 with a first quench transistor 118 at one end of the each bit line 112, a second quench transistor 118 at the other end of each bit line 112, and the remaining quench transistors 118 equally spaced along the bit line 112 between the first and second quench transistors 118.

In another embodiment, the position of each quench transistor 118 along each bit line 112 is defined by the following: $\frac{1}{2n}, \ldots, (2n-1)/2n$, where "n" equals the number of quench transistors 118 per bit line 112. For example, if two quench transistors 118 per bit line 112 are used, then the first quench transistor 118 is provided at ¼ the length of the bit line from a first end of the bit line and the second quench transistor 118 is provided at ¾ the length of the bit line from the first end of the bit line. If three quench transistors 118 per bit line 112 are used, then the first quench transistor 118 is provided at ⅙ the length of the bit line from a first end of the bit line, the second quench transistor 118 is provided at ⅜ (i.e., ½) the length of the bit line from the first end of the bit line, and the third quench transistor 118 is provided at ⅚ the length of the bit line from the first end of the bit line. This minimizes the RC-delay and hence allows maximum quench speed.

Each phase change memory cell 104 is electrically coupled to at least one word line 110 and a bit line 112. Phase change memory cell 104a is electrically coupled to bit line 112a and word line 110a, and phase change memory cell 104b is electrically coupled to bit line 112a and word line 110b. Phase change memory cell 104c is electrically coupled to bit line 112b and word line 110a, and phase change memory cell 104d is electrically coupled to bit line 112b and word line 110b. Each phase change memory cell 104 includes a phase change element and an access device (not shown). In one embodiment, the access device is a transistor, such as a field-effect transistor (FET), a bipolar transistor, or a 3D transistor structure. In other embodiments, the access device is a diode or diode-like structure.

Each phase change element comprises a phase change material that may be made up of a variety of materials in accordance with the present invention. Generally, chalcogenide alloys that contain one or more elements from group VI of the periodic table are useful as such materials. In one embodiment, the phase change material of each phase change element is made up of a chalcogenide compound material, such as GeSbTe, SbTe, GeTe or AgInSbTe. In another embodiment, the phase change material is chalcogen free, such as GeSb, GaSb, InSb, or GeGaInSb. In other embodiments, the phase change material is made up of any suitable material including one or more of the elements Ge, Sb, Te, Ga, As, In, Se, and S.

Each phase change element may be changed from an amorphous state to a crystalline state or from a crystalline state to an amorphous state under the influence of temperature change. The amount of crystalline material coexisting with amorphous material in the phase change material of one of the phase change elements thereby defines two or more states for storing data within memory device 100. In the amorphous state, a phase change material exhibits significantly higher resistivity than in the crystalline state. Therefore, the two or more states of the phase change elements differ in their electrical resistance. In one embodiment, the two or more states are two states and a binary system is used, wherein the two states are assigned bit values of "0" and "1". In another embodiment, the two or more states can be three states and a ternary system can be used, wherein the three states are assigned bit values of "0", "1", and "2". In another embodiment, the two or more states are four states that can be assigned multi-bit values, such as "00", "01", "10", and "11". In other embodiments, the two or more states can be any suitable number of states in the phase change material of a phase change element.

Controller 120 includes a microprocessor, microcontroller, or other suitable logic circuitry for controlling the operation of memory device 100. Controller 120 controls read and write operations of memory device 100 including the application of control and data signals to memory array 101 through write circuit 124 and sense circuit 126. In one embodiment, write circuit 124 provides voltage pulses through signal path 125 and bit lines 112 to memory cells 104 to program the memory cells. In other embodiments, write circuit 124 provides current pulses through signal path 125 and bit lines 112 to memory cells 104 to program the memory cells.

Sense circuit 126 reads each of the two or more states of memory cells 104 through bit lines 112 and signal path 127. In one embodiment, to read the resistance of one of the memory cells 104, sense circuit 126 provides current that flows through one of the memory cells 104. Sense circuit 126 then reads the voltage across that one of the memory cells 104. In another embodiment, sense circuit 126 provides voltage across one of the memory cells 104 and reads the current that flows through that one of the memory cells 104. In another embodiment, write circuit 124 provides voltage across one of the memory cells 104 and sense circuit 126 reads the current that flows through that one of the memory cells 104. In another embodiment, write circuit 124 provides current that flows through one of the memory cells 104 and sense circuit 126 reads the voltage across that one of the memory cells 104.

During a set operation of phase change memory cell 104a, one or more set current or voltage pulses are selectively enabled by write circuit 124 and sent through bit line 112a to the phase change element of memory cell 104a, thereby heating the phase change element above its crystallization temperature (but usually below its melting temperature). In this way, the phase change element of memory cell 104a reaches its crystalline state or a partially crystalline and partially amorphous state during this set operation.

During a reset operation of phase change memory cell 104a, a reset current or voltage pulse is selectively enabled by write circuit 124 and sent through bit line 112a to the phase change element of memory cell 104a. The reset current or voltage quickly heats the phase change element above its melting temperature. As the current or voltage pulse is turned off, quench transistors 118a and 118b are selected by quench lines 114a and 114b, respectively, to rapidly discharge the current or voltage pulse on bit line 112a to common or ground 116. With the current or voltage pulse turned off and with quench transistors 118a and 118b rapidly discharging the current or voltage pulse to common or ground 116, the phase change element of memory cell 104a quickly quench cools into the amorphous state or a partially amorphous and partially crystalline state. Phase change memory cells 104b-104d and other phase change memory cells 104 in memory array 101 are set and reset similarly to phase change memory cell 104a using similar current or voltage pulses.

Figure 3:
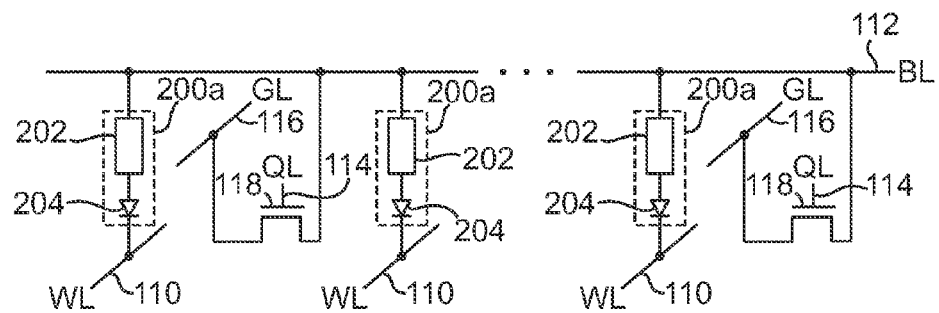
FIG. 3 is a diagram illustrating one embodiment of a single row or column of a memory array.

FIG. 3 is a diagram illustrating one embodiment of a single row or column of a memory array, such as memory array 101. In this embodiment, the single row or column includes diode selected phase change memory cells. The single row or column includes a bit line 112, a plurality of memory cells 200a, a plurality of word lines 110, two or more quench transistors 118, two or more quench lines 114, and two or more ground lines (GL) 116. In one embodiment, memory cells 200a provide phase change memory cells 104 previously described and illustrated with reference to FIG. 2.

Each memory cell 200a includes a phase change element 202 and a diode 204. In one embodiment, the polarity of diode 204 is reversed. One side of each phase change element 202 is electrically coupled to bit line 112, and the other side of each phase change element 202 is electrically coupled to one side of a diode 204. The other side of each diode 204 is electrically coupled to a word line 110. In another embodiment, one side of each phase change element 202 is electrically coupled to a word line 110, and the other side of each phase change element 202 is electrically coupled to one side of a diode 204. The other side of each diode 204 is electrically coupled to bit line 112.

One side of the source-drain path of each quench transistor 118 is electrically coupled to bit line 112. The other side of the source-drain path of each quench transistor 118 is electrically coupled to a ground line 116. The gate of each quench transistor 118 is electrically coupled to a quench line 114. At least two quench transistors 118 are electrically coupled to bit line 112. In other embodiments, any suitable number of quench transistors 118, such as three, four, or more, are electrically coupled to bit line 112 and distributed along the bit line. In one embodiment, ground line 116 may be a special word line, and may be at any suitable word line potential, including ground.

In one embodiment, during a set operation of a selected phase change memory cell 200a, one or more set current or voltage pulses are selectively enabled by write circuit 124 and sent through bit line 112 to the selected phase change element 202 thereby heating the selected phase change element 202 above its crystallization temperature (but usually below its melting temperature). In this way, the selected phase change element 202 reaches its crystalline state or a partially crystalline and partially amorphous state during this set operation.

During a reset operation of a selected phase change memory cell 200a, a reset current or voltage pulse is selectively enabled by write circuit 124 and sent through bit line 112 to the selected phase change element 202. The reset current or voltage quickly heats the selected phase change element 202 above its melting temperature. As the current or voltage pulse is turned off, quench transistors 118 are selected by quench lines 114 to rapidly discharge the current or voltage pulse on bit line 112 to common or ground line 116. With the current or voltage pulse turned off and with quench transistors 118 rapidly discharging the current or voltage pulse to common or ground line 116, the selected phase change element 202 quickly quench cools into the amorphous state or a partially amorphous and partially crystalline state.

Figure 4:
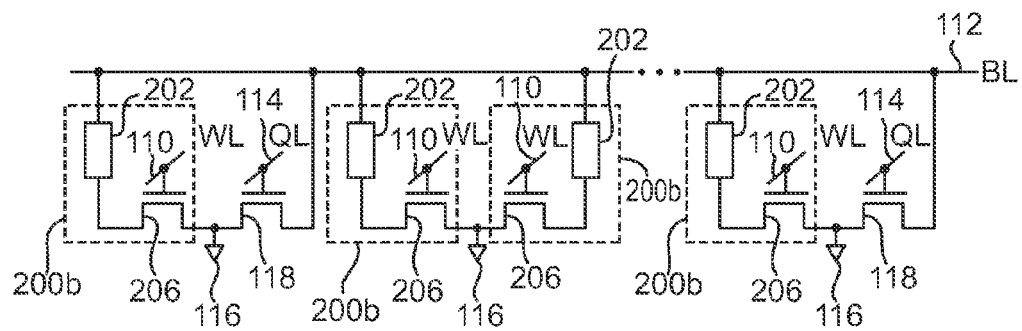
FIG. 4 is a diagram illustrating another embodiment of a single row or column of a memory array.

FIG. 4 is a diagram illustrating another embodiment of a single row or column of a memory array, such as memory array 101. In this embodiment, the single row or column includes single gate FET selected phase change memory cells. The single row or column includes a bit line 112, a plurality of memory cells 200b, a plurality of word lines 110, two or more quench transistors 118, and two or more quench lines 114. In one embodiment, memory cells 200b provide phase change memory cells 104 previously described and illustrated with reference to FIG. 2.

Each phase change memory cell 200b includes a phase change element 202 and a transistor 206. One side of each phase change element 202 is electrically coupled to bit line 112, and the other side of each phase change element 202 is electrically coupled to one side of the source-drain path of a transistor 206. The other side of the source-drain path of each transistor 206 is electrically coupled to common or ground 116. The gate of each transistor 206 is electrically coupled to a word line 110.

One side of the source-drain path of each quench transistor 118 is electrically coupled to bit line 112. The other side of the source-drain path of each quench transistor 118 is electrically coupled to common or ground 116 and to the source-drain path of an adjacent transistor 206. The gate of each quench transistor 118 is electrically coupled to a quench line 114. In one embodiment, quench lines 114 are parallel to and in the same plane as word lines 110. At least two quench transistors 118 are electrically coupled to bit line 112. In other embodiments, any suitable number of quench transistors 118, such as three, four, or more, are electrically coupled to bit line 112 and distributed along the bit line.

In one embodiment, quench transistors 118 have the same dimensions as transistors 206 and are fabricated simultaneously with transistors 206. In one embodiment, an array of single gate FET phase change memory cells 200b without quench transistors 118 is fabricated. Line lithography is then used to remove the phase change elements 202 where the quench transistors 118 are to be located. The removed phase change elements 202 are replaced with contacts to bit line 112 to electrically couple quench transistors 118 to bit line 112. In another embodiment, the phase change elements 202 where quench transistors 118 are to be located are excluded in the relevant lithography levels and contacts are fabricated in their place to electrically couple the quench transistors 118 to bit line 112.

During a set operation of a selected phase change memory cell 200b, the word line 110 for the selected memory cell 200b is selected to activate the transistor 206 for the selected memory cell 200b. With the transistor 206 activated, one or more set current or voltage pulses are selectively enabled by write circuit 124 and sent through bit line 112 to the selected phase change element 202 thereby heating the selected phase change element 202 above its crystallization temperature (but usually below its melting temperature). In this way, the selected phase change element 202 reaches its crystalline state or a partially crystalline and partially amorphous state during this set operation.

During a reset operation of a selected phase change memory cell 200b, the word line 110 for the selected memory cell 200b is selected to activate the transistor 206 for the selected memory cell 200b. With the transistor 206 activated, a reset current or voltage pulse is selectively enabled by write circuit 124 and sent through bit line 112 to the selected phase change element 202. The reset current or voltage quickly heats the selected phase change element 202 above its melting temperature. As the current or voltage pulse is turned off, quench transistors 118 are selected by quench lines 114 to rapidly discharge the current or voltage pulse on bit line 112 to common or ground 116. With the current or voltage pulse turned off and with quench transistors 118 rapidly discharging the current or voltage pulse to common or ground 116, the selected phase change element 202 quickly quench cools into the amorphous state or a partially amorphous and partially crystalline state.

Figure 5:
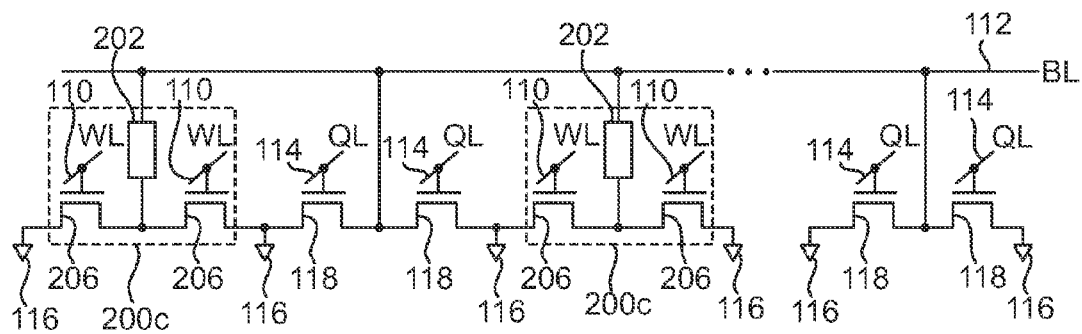
FIG. 5 is a diagram illustrating another embodiment of a single row or column of a memory array.

FIG. 5 is a diagram illustrating another embodiment of a single row or column of a memory array, such as memory array 101. In this embodiment, the single row or column includes dual gate FET phase change memory cells. The single row or column includes a bit line 112, a plurality of memory cells 200c, a plurality of word lines 110, two or more quench transistors 118, and two or more quench lines 114. In one embodiment, memory cells 200c provide phase change memory cells 104 previously described and illustrated with reference to FIG. 2.

Each phase change memory cell 200c includes a phase change element 202 and two transistors 206. One side of each phase change element 202 is electrically coupled to bit line 112, and the other side of each phase change element 202 is electrically coupled to one side of the source-drain path of two transistors 206. The other side of the source-drain path of each transistor 206 is electrically coupled to common or ground 116. The gate of each transistor 206 is electrically coupled to a word line 110.

One side of the source-drain path of two adjacent quench transistors 118 is electrically coupled to bit line 112. The other side of the source-drain path of each quench transistor 118 is electrically coupled to common or ground 116 and to the source-drain path of an adjacent transistor 206. The gate of each quench transistor 118 is electrically coupled to a quench line 114. In one embodiment, quench lines 114 are parallel to and in the same plane as word lines 110. At least two quench transistors 118 are electrically coupled to bit line 112. In other embodiments, any suitable number of quench transistors 118, such as four, six, or more, are electrically coupled to bit line 112 and distributed along the bit line.

In one embodiment, quench transistors 118 have the same dimensions as transistors 206 and are fabricated simultaneously with transistors 206. In one embodiment, an array of dual gate FET phase change memory cells 200c without quench transistors 118 is fabricated. Line lithography is then used to remove the phase change elements 202 where the quench transistors 118 are to be located. The removed phase change elements 202 are replaced with contacts to bit line 112 to electrically couple quench transistors 118 to bit line 112. In another embodiment, the phase change elements 202 where quench transistors 118 are to be located are excluded in the relevant lithography levels and contacts are fabricated in their place to electrically couple the quench transistors 118 to bit line 112.

During a set operation of a selected phase change memory cell 200c, the word lines 110 for the selected memory cell 200c are selected to activate the transistors 206 for the selected memory cell 200c. With the transistors 206 activated, one or more set current or voltage pulses are selectively enabled by write circuit 124 and sent through bit line 112 to the selected phase change element 202 thereby heating the selected phase change element 202 above its crystallization temperature (but usually below its melting temperature). In this way, the selected phase change element 202 reaches its crystalline state or a partially crystalline and partially amorphous state during this set operation.

During a reset operation of a selected phase change memory cell 200c, the word lines 110 for the selected memory cell 200c are selected to activate the transistors 206 for the selected memory cell 200c. With the transistors 206 activated, a reset current or voltage pulse is selectively enabled by write circuit 124 and sent through bit line 112 to the selected phase change element 202. The reset current or voltage quickly heats the selected phase change element 202 above its melting temperature. As the current or voltage pulse is turned off, quench transistors 118 are selected by quench lines 114 to rapidly discharge the current or voltage pulse on bit line 112 to common or ground 116. With the current or voltage pulse turned off and with quench transistors 118 rapidly discharging the current or voltage pulse to common or ground 116, the selected phase change element 202 quickly quench cools into the amorphous state or a partially amorphous and partially crystalline state.

Figure 6:
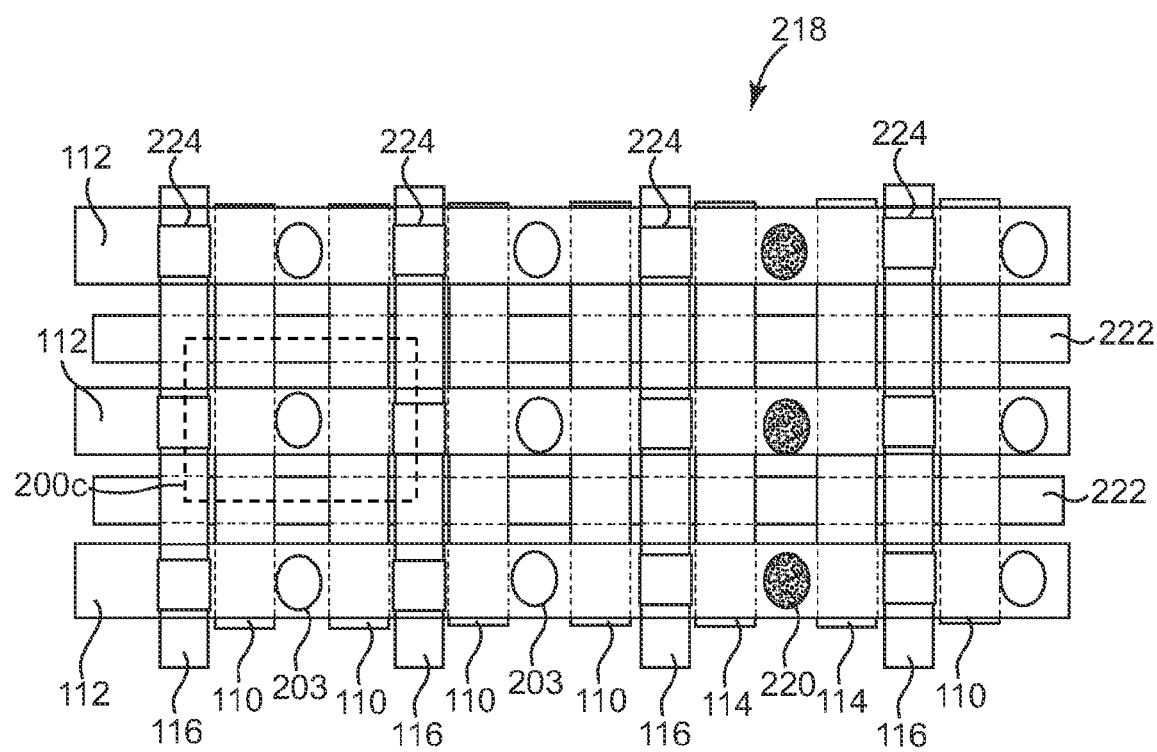
FIG. 6 is a diagram illustrating one embodiment of a memory array.

FIG. 6 is a diagram illustrating one embodiment of a memory array 218. In one embodiment, memory array 218 provides memory array 101. Memory array 218 illustrates one embodiment of a layout for a dual gate FET phase change memory array. Memory array 218 includes bit lines 112, shallow trench isolation (STI) 222, ground lines 116, word lines 110, quench lines 114, ground line contacts 224, phase change element contacts 203, and bit line contacts 220.

A memory cell 200c as previously described and illustrated with reference to FIG. 5 is indicated by the dashed lines. Bit lines 112 are perpendicular to ground lines 116, word lines 110, and quench lines 114. In one embodiment, quench lines 114 are in the same plane as word lines 110. Ground line contacts 224 electrically couple one side of the source-drain path of each transistor of a memory cell 200c and each quench transistor to a ground line 116. Phase change element contacts 203 electrically couple the other side of the source-drain path of each transistor of a memory cell 200c to a phase change element. Bit line contacts 220 electrically couple one side of the source-drain path of two adjacent quench transistors to a bit line 112. STI 222 electrically isolates adjacent transistors from each other.

Figure 7:
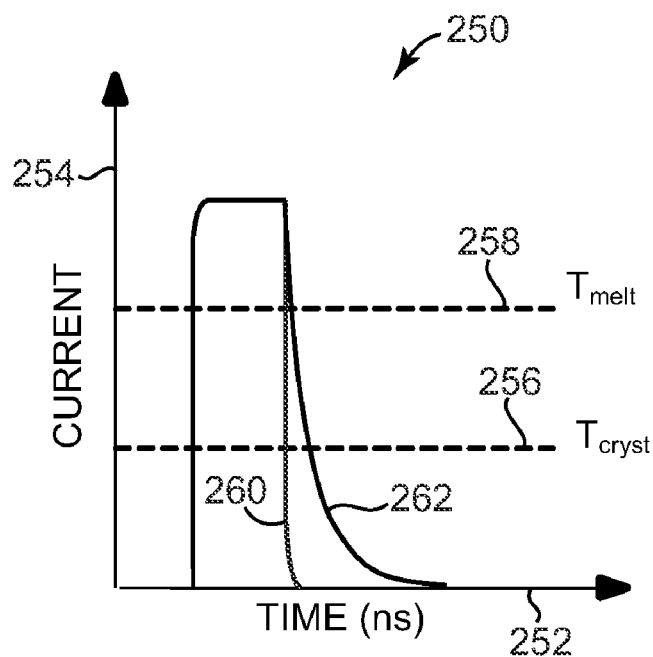
FIG. 7 is a chart illustrating one embodiment of a reset signal for programming a phase change memory cell to an amorphous state.

FIG. 7 is a chart 250 illustrating one embodiment of a reset signal for programming a phase change memory cell to an amorphous state. Chart 250 includes time in nanoseconds on x-axis 252 and current on y-axis 254. Chart 250 illustrates a reset pulse including a quench portion 260 where at least two quench transistors 118 are activated and a quench portion 262 where no additional quench transistors 118 are activated. The reset pulse quickly rises above the melting temperature ($T_{melt}$) 258 of the phase change material. With at least two quench transistors 118 activated, the reset pulse quickly falls below the crystallization temperature ($T_{cryst}$) 256 of the phase change material and to zero as indicated at 260. If quench transistors 118 are not activated, the reset pulse takes longer to fall below the crystallization temperature 256 of the phase change material and to zero as indicated at 262. The faster quench times enabled by quench transistors 118 prevent the phase change material from recrystallizing during the quench time.

Figure 8:
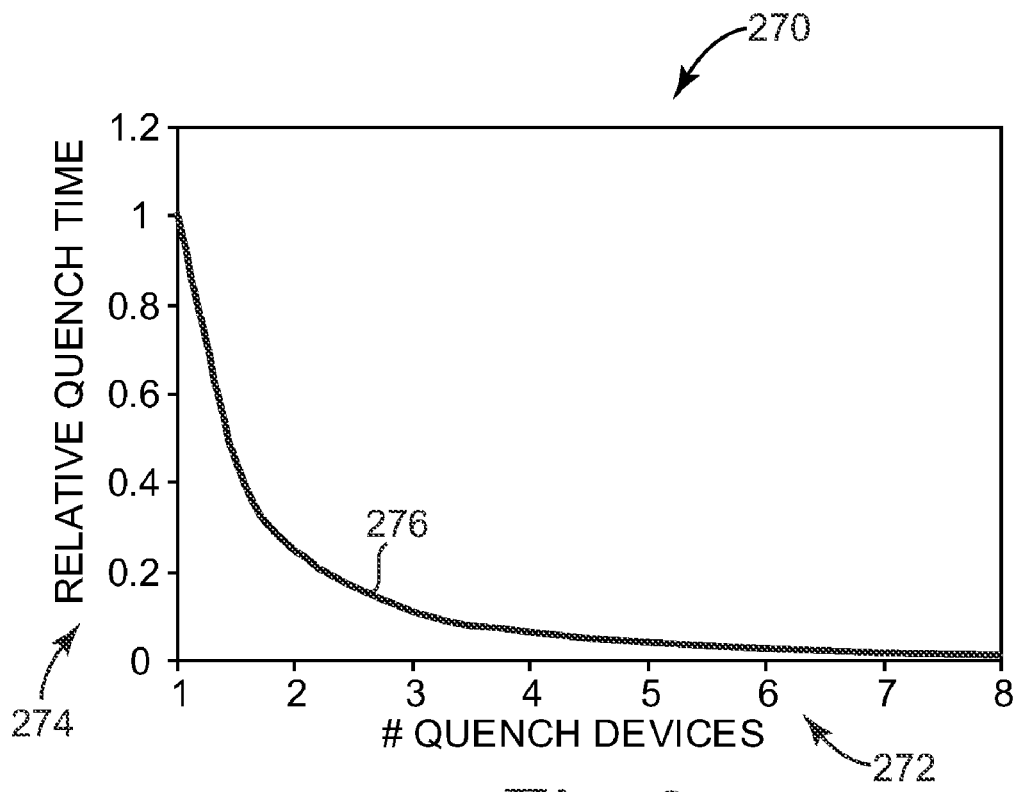
FIG. 8 is a chart illustrating one embodiment of the relationship between quench devices and quench time.

FIG. 8 is a chart 270 illustrating one embodiment of the relationship between quench devices and quench time. Chart 270 includes number of quench devices on x-axis 272 and relative quench time on y-axis 274. As indicated by curve 276, as the number of quench devices provided along a bit line is increased, the relative quench time is decreased. For example, by using two quench devices, the relative quench time may be reduced by over 70%. By using three quench devices, the relative quench time may be reduced by over 80%.

Embodiments provide a phase change memory array including quench devices for rapidly discharging bit line signals after a reset pulse is applied to a memory cell to reset the memory cell to the amorphous state. Two or more quench devices are provided along each bit line. The quench devices can be used in memory arrays including memory cells accessed by diodes or memory cells accessed by transistors. By including the quench devices to reduce the quench times, phase change materials having shorter crystallization times can be used. In addition, the shorter quench times enable memory arrays having longer bit lines and smaller effective memory cell sizes to be fabricated.

While the specific embodiments described herein substantially focused on using phase change memory elements, the embodiments can be applied to any suitable type of resistive or resistivity changing memory elements.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A memory comprising:
   a bit line;
   phase change memory cells coupled to the bit line;
   a circuit coupled to the bit line, the circuit configured to perform a reset operation of a memory cell; and
   at least two means for quenching a write signal on the bit line during a reset operation of a memory cell,
   wherein the means for quenching comprise at least two quench transistors directly connected to the bit line at different points along the bit line, each of the at least two quench transistors comprising a source-drain path coupled between the bit line and a common or ground,
   wherein each phase change memory cell comprises a selection transistor coupled to a phase change element, and
   wherein each selection transistor includes dimensions equal to dimensions of each quench transistor.

2. The memory of claim 1, wherein each phase change memory cell comprises a single gate transistor memory cell.

3. The memory of claim 1, wherein each phase change memory cell comprises a dual gate transistor memory cell.

4. The memory of claim 1, wherein a first means for quenching the write signal is directly connected to one end of the bit line and a second means for quenching the write signal is directly connected to the other end of the bit line.

5. A method for programming a memory, the method comprising:
   selecting, via a circuit, a phase change memory cell to be reset;
   applying, via the circuit, a reset signal to a bit line coupled to the memory cell; and
   selecting, via the circuit, at least two quench transistors directly connected to the bit line at different points along the bit line to quench the reset signal to complete the resetting of the memory cell,
   wherein selecting the phase change memory cell comprises selecting an access transistor coupled to a phase change element, and wherein selecting the at least two quench transistors comprises selecting at least two quench transistors having dimensions equal to dimensions of the access transistor.

6. The method of claim 5, wherein selecting the at least two quench transistors comprises selecting at least three quench transistors distributed along the bit line.

7. The method of claim 5, wherein selecting the memory cell comprises selecting one of a single gate transistor memory cell and a dual gate transistor memory cell.

8. The method of claim 5, wherein selecting the at least two quench transistors comprises selecting a first quench transistor directly connected to one end of the bit line and a second quench transistor directly connected to the other second end of the bit line.

9. A memory comprising:
    a line;
    at least two quench devices directly connected to the line at different points along the line;
    a phase change memory cell coupled to the line; and
    a circuit coupled to the line, the circuit configured to perform a write operation of the memory cell,
    wherein the at least two quench devices are configured to quench a write signal on the line during a write operation of the memory cell, and
    wherein the quench devices are coupled to the line at a distance from one end of the line as defined by $½n, \ldots, (2n-1)/2n$, where "n" equals the number of quench devices.

10. The memory of claim 9, wherein the at least two quench devices comprise at least three quench devices distributed along the line.

11. The memory of claim 9, wherein the quench devices comprise transistors.

12. The memory of claim 9, wherein the phase change memory cell comprises a transistor coupled to a phase change element.

13. The memory of claim 9, wherein the phase change memory cell comprises a diode coupled to a phase change element.

14. A method for programming a memory, the method comprising:
    selecting, via a circuit, a phase change memory cell to be programmed;
    applying, via the circuit, a write signal to a line coupled to the selected memory cell; and
    selecting, via the circuit, at least two quench devices directly connected to the line at different points along the line to quench the write signal to complete the programming of the selected memory cell,
    wherein selecting the at least two quench devices comprises selecting an "n" number of quench devices coupled to the line at a distance from one end of the line as defined by $½n, \ldots, (2n-1)/2n$.

15. The method of claim 14, wherein selecting the memory cell comprises selecting a transistor coupled to a phase change element.

16. The method of claim 14, wherein selecting the memory cell comprises selecting two transistors coupled to a phase change element.

17. The method of claim 14, wherein selecting the memory cell comprises applying voltages to a cross-point array of phase change elements.

18. The method of claim 14, wherein selecting the at least two quench devices comprises selecting at least three quench devices distributed along the line.

* * * * *